United States Patent
Robins et al.

(10) Patent No.: US 10,262,985 B2
(45) Date of Patent: Apr. 16, 2019

(54) CIRCUITS AND METHODS FOR LOWERING LEAKAGE IN ULTRA-LOW-POWER MOS INTEGRATED CIRCUITS

(71) Applicant: Perceptia Devices, Inc., Scotts Valley, CA (US)

(72) Inventors: Timothy Robins, Santa Cruz, CA (US); Julian Jenkins, Kurraba Point (AU)

(73) Assignee: Perceptia IP Pty Ltd, Kurraba Point (AU)

( * ) Notice: Subject to any disclaimer, the term of this patent is extended or adjusted under 35 U.S.C. 154(b) by 12 days.

(21) Appl. No.: 15/589,975

(22) Filed: May 8, 2017

(65) Prior Publication Data
US 2017/0330874 A1     Nov. 16, 2017

Related U.S. Application Data

(60) Provisional application No. 62/334,230, filed on May 10, 2016.

(51) Int. Cl.

| | |
|---|---|
| *G05F 1/10* | (2006.01) |
| *G05F 3/02* | (2006.01) |
| *H01L 27/02* | (2006.01) |
| *H03K 19/003* | (2006.01) |
| *H03K 19/0948* | (2006.01) |
| *H01L 27/11* | (2006.01) |
| *H03K 19/00* | (2006.01) |
| *G05F 3/20* | (2006.01) |

(52) U.S. Cl.
CPC ...... *H01L 27/0251* (2013.01); *H01L 27/1104* (2013.01); *H03K 19/00315* (2013.01); *H03K 19/0948* (2013.01); *G05F 3/205* (2013.01); *H03K 19/0013* (2013.01); *H03K 19/0016* (2013.01); *H03K 19/00361* (2013.01); *H03K 2217/0036* (2013.01)

(58) Field of Classification Search
CPC ..... H03K 19/0016; G06F 1/3203; G06F 1/32; G06F 1/3296; G11C 5/147
USPC .................................... 327/544, 308, 534
See application file for complete search history.

(56) References Cited

U.S. PATENT DOCUMENTS 5,583,457 A * 12/1996 Horiguchi ............. G06F 1/3203
                                                              326/121
5,880,604 A *  3/1999 Kawahara ........ H03K 3/356113
                                                              326/121

(Continued)

*Primary Examiner* — Anh Q Tra
(74) *Attorney, Agent, or Firm* — André Henri Grouwstra

(57) ABSTRACT

A block of logic gates has MOS transistors whose body terminals are connected with a body voltage rail and whose source terminals are connected with a logic reference voltage rail. The logic reference voltage rail is connected to the body voltage rail via a resistor. The resistor creates a negative feedback loop for leakage currents that stabilizes a reverse body bias voltage and reduces the influence of temperature, voltage, and process variations.

The block may be NMOS, PMOS, or CMOS. In the case of CMOS, there are two body voltage rails, powered by a voltage source, two logic reference voltage rails, and two resistors. The reverse body bias voltages over the two resistors may be stabilized by decoupling capacitors. The two resistors may be trimmable. The resistors may be calibrated such that leakage currents are at a minimum value and the logic gates can switch just fast enough.

9 Claims, 13 Drawing Sheets

(56) References Cited

U.S. PATENT DOCUMENTS

| | | | | |
|---|---|---|---|---|
| 5,959,927 A | * | 9/1999 | Yamagata | G11C 5/14 365/226 |
| 6,049,245 A | * | 4/2000 | Son | G11C 5/147 326/17 |
| 7,274,217 B2 | * | 9/2007 | Chuang | H01L 21/823857 257/369 |
| 2006/0097775 A1 | * | 5/2006 | Zhu | H03K 19/0008 327/544 |

* cited by examiner

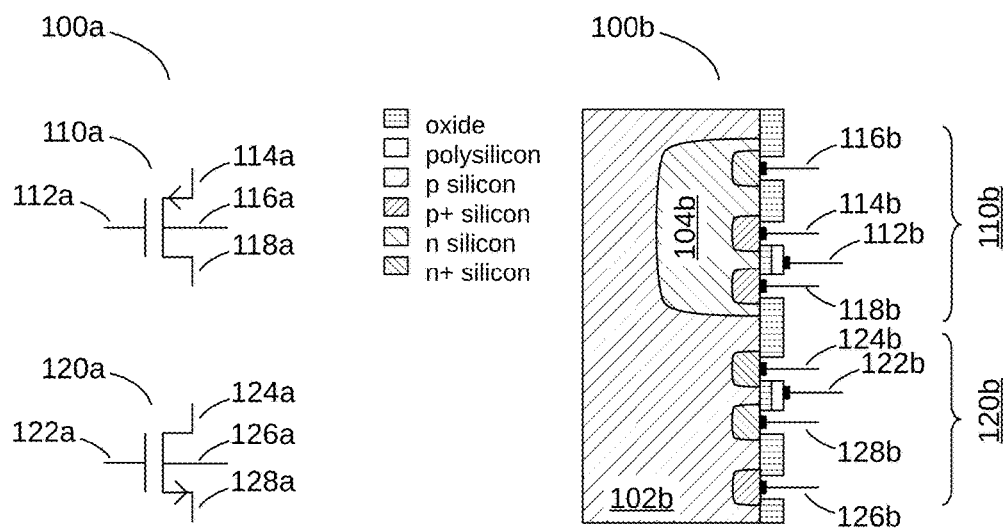
Fig. 1 - Prior Art
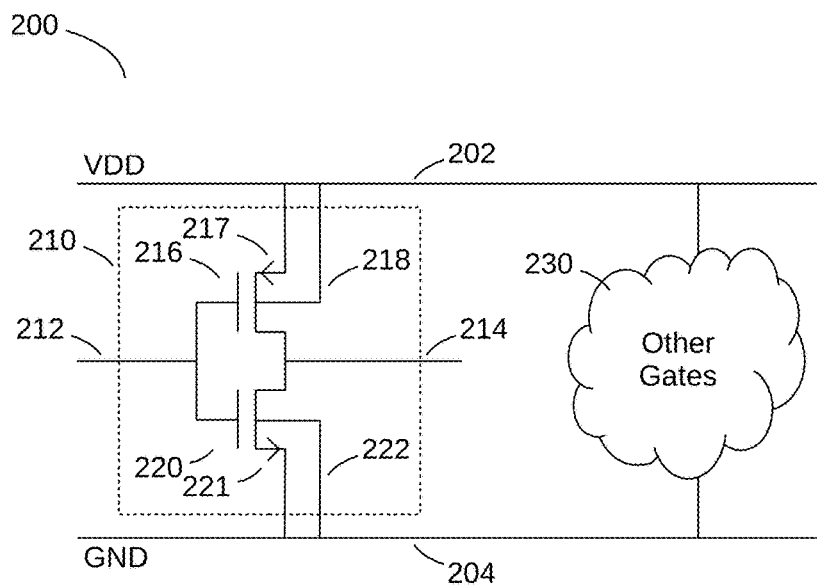
Fig. 2 - Prior Art

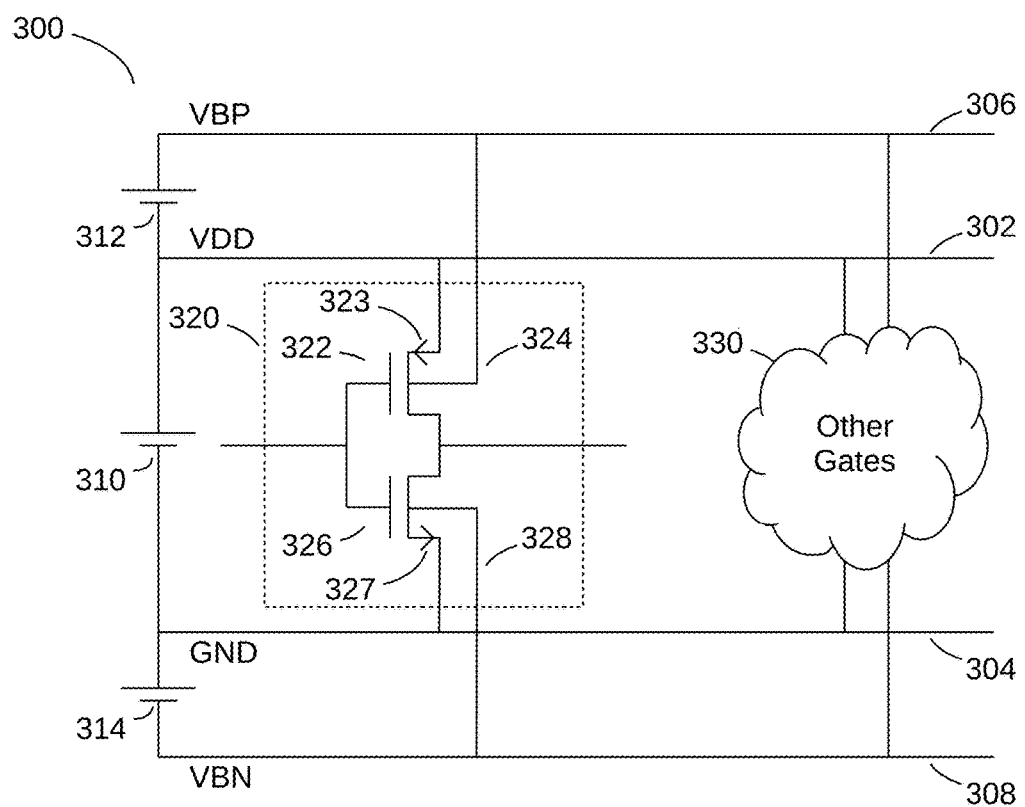
Fig. 3A - Prior Art
Reverse Body Biasing

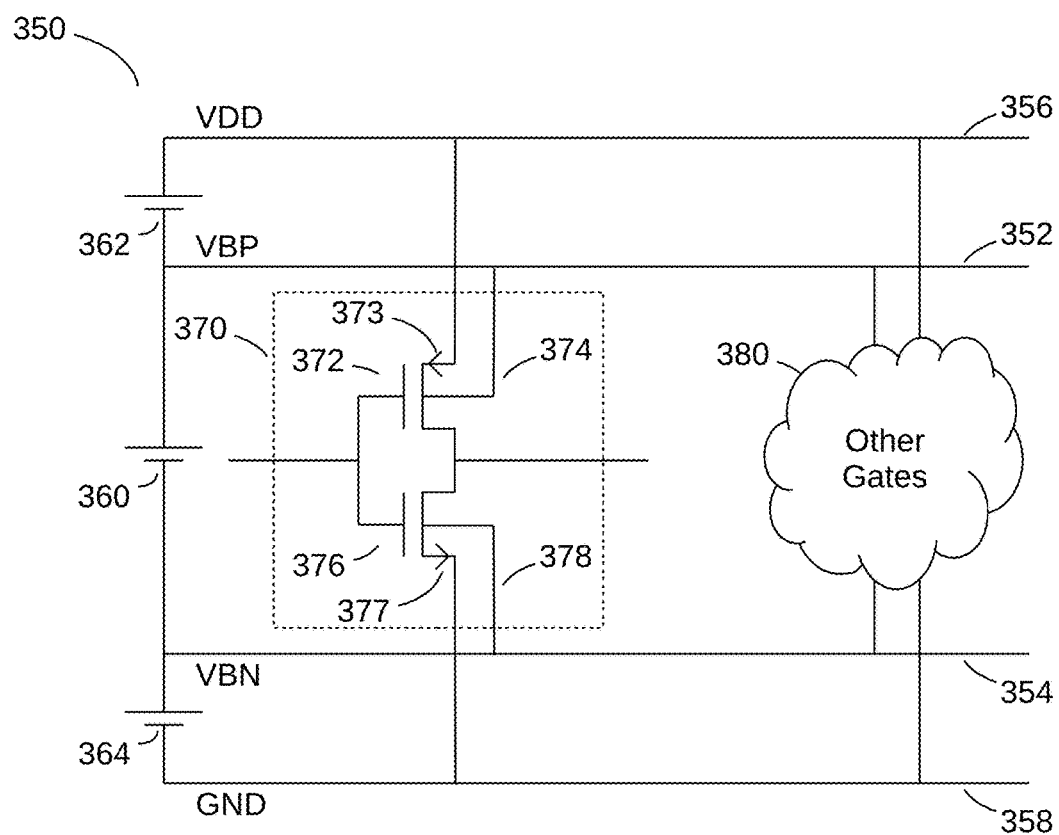
Fig. 3B - Prior Art
Forward Body Biasing

CIRCUITS AND METHODS FOR LOWERING LEAKAGE IN ULTRA-LOW-POWER MOS INTEGRATED CIRCUITS

CROSS REFERENCES TO RELATED APPLICATIONS

This application claims priority from U.S. Provisional Patent Application Ser. No. 62/334,230, entitled "Circuits and Methods for Lowering Leakage in Ultra-Low-Power MOS Integrated Circuits", filed on May 10, 2016, which is hereby incorporated by reference as if set forth in full in this application for all purposes.

BACKGROUND

The present invention relates to circuits and methods for optimization of power in integrated circuits (ICs) and particularly in ultra-low-power metal-oxide-semiconductor (MOS) and complementary metal-oxide-semiconductor (CMOS) logic circuits.

ICs designed for ultra-low-power applications require optimization (minimization) of both static and dynamic power dissipation. Static power dissipation is caused by steady-state current leaking. Dynamic power dissipation is caused by additional currents needed when logic circuits switch between low and high states. Reduction of dynamic power dissipation can be achieved by switching circuits no more often than strictly needed. In MOS and CMOS technologies, leakage currents and logic switching speeds are correlated, so reduction of static power dissipation can be achieved by reducing leakage currents to the minimum at which logic gates can switch at their required speed.

CMOS manufacturing processes are popular for digital ICs as they offer relatively low current leakage for general-purpose applications, as will be explained below. Several CMOS process technologies exist, including P-type substrate with N-wells, with deep N-wells, or triple-wells, silicon-on-insulator (SOI), and others. P-type substrate with N-wells is one of the simplest and therefore least expensive ways to make CMOS.

FIG. 1 illustrates examples of transistors used in CMOS ICs. Example 100a provides schematic views of P-type semiconductor MOS (PMOS) transistor 110a and N-type semiconductor MOS (NMOS) transistor 120b. Example 100b provides cross-sections of a silicon implementation of PMOS transistor 110b and NMOS transistor 120b, in a P-type substrate with N-well technology.

A MOS (PMOS or NMOS) transistor, as used in this specification, includes four terminals electrically coupling to: a (metal or semiconductor, such as polysilicon) gate, a (semiconductor) source, a (semiconductor) drain, and a (semiconductor) body. The MOS transistor has a body into which the source and drain are diffused. A MOS transistor may have its individual body, or share a body with other MOS transistors of the same or a similar type. The MOS transistor has a channel for conducting current between its source and drain. The channel is situated in the body under the gate and under an oxide insulator, typically silicon-dioxide. The channel's conductivity can be controlled by a voltage VGS between the gate and source. It is further determined by a static threshold voltage Vt.

PMOS transistor 110a has gate terminal 112a, source terminal 114a, body terminal 116a, and drain terminal 118a. NMOS transistor 120a has gate terminal 122a, drain terminal 124a, body terminal 126a, and source terminal 128a.

PMOS transistor 110b and NMOS transistor 120b are physically implemented on a wafer that may include P-silicon bulk 102b (e.g., a P-type substrate). PMOS transistor 110b includes, or is included in, a well of N-type silicon (an N-well) 104b diffused into bulk 102b. N-well 104b forms the body of PMOS transistor 110b. PMOS transistor 110b has gate terminal 112b, source terminal 114b, body terminal 116b (this is a terminal to the N-well 104b body), and drain terminal 118b. Source terminal 114b connects to a source of P+ silicon diffused into N-well 104b. Drain terminal 118b connects to a drain of P+ silicon diffused into N-well 104b. Gate terminal 112b connects to a gate of poly-silicon over a silicon-dioxide insulator over a channel in N-well 104b between the source and the drain. Body terminal 116b connects to N-well 104b via N+ silicon diffused into N-well 104b.

Bulk 102b forms the body of NMOS transistor 120b, which has a gate terminal 122b, drain terminal 124b, body terminal 126b, and source terminal 128b. Drain terminal 124b connects to a drain of N+ silicon diffused into bulk 102b. Source terminal 128b connects to a source of N+ silicon diffused into bulk 102b. Gate terminal 122b connects to a gate of poly-silicon over silicon-dioxide over a channel in bulk 102b between the source and the drain. Body terminal 126b connects to bulk 102b via P+ silicon diffused into bulk 102b.

In normal operation, N-well 104b may be kept ("biased"), via terminal 116b, at the highest voltage in an integrated system, and bulk 102b may be biased, via terminal 126b, at the lowest voltage in the system. This way, bulk 102b forms zero-biased or reverse-biased diodes with N-well 104b, drain 124b, and source 128b. N-well 104b forms zero-biased or reverse-biased diodes with source 114b and drain 118b. Zero-biased diodes carry no current. Reverse-biased diode may carry a negligibly small leakage current. Therefore, bulk 102b effectively insulates NMOS transistor 120b from any other devices, and N-well 104b effectively insulates PMOS transistor 110b from any other devices.

CMOS logic circuits use both PMOS and NMOS transistors, where gate terminals may be used to input signals, drain terminals to output signals, and source terminals for signal reference. Transistor body terminals are for biasing only, to provide adequate insulation. Most often, CMOS gates include PMOS transistors whose sources couple to the highest available voltage and NMOS transistors whose sources couple to the lowest available voltage. Therefore, in standard CMOS gates, PMOS transistors typically couple their source terminals directly to their body (i.e. N-well) terminal, and NMOS transistors typically couple their source terminals directly to their body (i.e. bulk) terminal.

FIG. 2 illustrates an example 200 of conventional CMOS logic design. CMOS logic design 200 includes inverter 210 and other logic gates 230. Inverter 210 and other logic gates 230 take their energy from power supply (VDD) rail 202, returning used currents to ground (GND) rail 204. Inverter 210 may include a PMOS transistor 216 and an NMOS transistor 220. Inverter 210 has an input 212 coupled with the gates of both MOS transistors 216 and 220. Source terminal 217 and body terminal 218 of transistor 216 are coupled with VDD rail 202, whereas source terminal 221 and body terminal 222 of transistor 220 are coupled with GND rail 204. Inverter 210 has an output 214 coupled with drains of both transistors 216 and 220.

Similar to inverter 210, other logic gates 230 will typically couple their PMOS transistor body terminals to VDD rail 202 and their NMOS transistor body terminals to GND rail 204. CMOS gates, such as inverter 210, are popular because of their relatively low use of energy. For instance, when a high voltage (close to VDD level) is applied to input 212, PMOS transistor 216 will conduct very little, i.e. almost no current flows from VDD rail 202 via its source terminal to its drain terminal. Hence, almost no current flows from NMOS transistor 220's drain via its source to GND rail 204. When a low voltage (close to GND level) is applied to input 210, NMOS transistor 220 will conduct very little, i.e. almost no current flows to GND rail 204 via its source terminal from its drain terminal. Hence, almost no current flows from VDD rail 202 via PMOS transistor 216's source to its drain. Thus, when inverter 210 is in a steady state, very little current flows. The same holds for other logic gates in CMOS, such as NANDs, NORs, etc.

The level of conductance (or insulation) in a MOS transistor's channel depends on a voltage VGS applied between its gate and its source with respect to its threshold voltage Vt, which in turn is dependent on a voltage VSB between the source and the body. When VGS is larger than Vt, a channel conducts maximally, and when VGS is smaller than Vt the channel's conductance is reduced. Many CMOS processes have been developed to operate at low voltages. A CMOS process may offer transistors with one or more threshold voltages: high-Vt transistors offer low leakage, at the expense of speed; low-Vt transistors may offer high speed at the expense of leakage; zero-Vt transistors offer even higher speed at the expense of additional leakage. Zero-Vt transistors may be useful for bypass switches and (analog) source followers.

To allow for simple logic circuits, high-Vt and low-Vt threshold voltages are designed to be useful even when VSB equals zero, i.e. when a MOS transistor source is directly coupled with its body. In those cases, when VGS equals zero, the channel will have a small remaining conductance compared to when VGS is larger than Vt. The remaining conductance will allow a small current to pass the channel, which is a main component of the MOS transistor's leakage current that causes static power dissipation.

When a gate or inverter is switched from a low to a high state or vice versa, its input(s) and output(s) additionally dissipate power dynamically. This is caused by parasitic capacitances cGB between gate and body, and cDB between drain and body, that need to be charged or discharged from a prior state to a new state. Dynamic power dissipation due to charging and discharging parasitic capacitances is proportional to the average frequency of switching the gate or inverter and to the square of the parasitic capacitances' voltage swing, usually practically the supply voltage VDD. Dynamic power dissipation may further be exacerbated if during some part of the switch time both a PMOS and an NMOS transistor are conducting, and a direct path with low conductance exists between the VDD and GND rails.

In many applications, standard logic gates available in standard CMOS processes provide reasonable compromises between speed of switching, dynamic power dissipation due to switching, and static power dissipation due to leakage. However, for some ultra-low-power applications, the compromise and optimization options offered by standard logic gates are not acceptable. For instance, in applications that are dependent on power harvesting, such as passive radio-frequency identification (RFID) tags, or that require a very long battery life, static power dissipation must be reduced to much smaller levels than offered by standard logic cells.

A standard way to reduce power dissipation in an IC it to implement clock gating. Temporarily unused blocks of logic receive no clock pulses, and are therefore in a steady state. Although this reduces dynamic power dissipation, it does not address static power dissipation. Further standard solutions include using high-Vt logic gates for slowly switching signals and low-Vt logic gates for fast switching signals. This somewhat reduces static power dissipation, but not by much.

A further conventional solution to also reduce static power dissipation is to implement power gating for logic blocks that are temporarily not in use. In power gating, one or more switches interrupt all power to those blocks. However, a disadvantage of this solution is that the switch(es) may cost a lot of area to maintain low noise levels in the supplied power. Another disadvantage is that circuits that are in use may still suffer from high static power dissipation. Yet another conventional solution is to use body biasing—biasing a device's body at a different voltage than its embedded source.

FIGS. 3A-B illustrate conventional examples 300 of reverse body biasing for reducing leakage current and 350 of forward body biasing for increasing speed. Example 300 in FIG. 3A includes inverter 320 and other logic gates 330. Supply voltage source 310 coupled to GND rail 304 provides a supply voltage for VDD rail 302. First body-bias voltage source 312 supplies first body-bias voltage VBP for N-well body-bias rail 306, and second body-bias voltage source 314 supplies second body-bias voltage VBN for bulk body-bias rail 308. Inverter 320 includes PMOS transistor 322 with a source 323 coupled to VDD rail 302 and body terminal 324 coupled to N-well body-bias rail 306. It further includes NMOS transistor 326 with a source 327 coupled to GND rail 304 and body terminal 328 coupled to bulk body-bias rail 308. Similarly, other logic gates 330 include PMOS transistors with sources coupled to VDD rail 302 and body terminals coupled to N-well body-bias rail 306, and NMOS transistors with sources coupled to GND rail 304 and body terminals coupled to bulk body-bias rail 308. First body-bias voltage VBP is higher than VDD, and second body-bias voltage VBN is lower than GND. As a result of higher source-to-bulk voltage VBS for PMOS transistor 322 and NMOS transistor 326—compared to PMOS transistor 216 and NMOS transistor 220 in FIG. 2—threshold voltages Vt are increased and static leakage currents are reduced. This reverse body biasing lowers the capability of inverter 370 to switch fast.

Example 350 in FIG. 3B includes inverter 370 and other logic gates 380. Supply voltage sources 360-364 coupled to GND rail 358 provide a supply voltage for VDD rail 356. First body-bias voltage source 362 reduces first body-bias voltage VBP for N-well body-bias rail 352, and second body-bias voltage source 364 reduces second body-bias voltage VBN for bulk body-bias rail 354. Inverter 370 includes PMOS transistor 372 with a source 373 coupled to VDD rail 356 and body terminal 374 coupled to N-well body-bias rail 352. It further includes NMOS transistor 376 with a source 377 coupled to GND rail 358 and body terminal 378 coupled to bulk body-bias rail 354. Similarly, other logic gates 380 include PMOS transistors with sources coupled to VDD rail 356 and body terminals coupled to N-well body-bias rail 352, and NMOS transistors with sources coupled to GND rail 358 and body terminals coupled to bulk body-bias rail 354. First body-bias voltage VBP is lower than VDD, and second body-bias voltage VBN is higher than GND. As a result of lower source-to-bulk voltage VBS for PMOS transistor 372 and NMOS transistor 376—compared to PMOS transistor 216 and NMOS transistor 220 in FIG. 2—threshold voltages Vt are reduced and static leakage currents are increased. This forward body biasing increases the capability of inverter 370 to switch fast.

However, the solutions in FIGS. 3A-B still have disadvantages. The addition of first and second body-bias voltage sources increases complexity and cost. If batteries are used, as drawn, this solution may add the cost of the two additional batteries and at least two extra pins on an IC package. If they include voltage regulators or charge pumps, this solution may decrease efficiency because of static and dynamic power consumption by the regulators or charge pumps. Another disadvantage is that designers may have to observe a greater minimum channel length (gate length) for devices that use reverse body biasing.

The present invention, as presented in this specification, aims to address these and other problems in ultra-low-power logic circuits.

Reference to any prior art in the specification is not, and should not be taken as, an acknowledgment or any form of suggestion that this prior art forms part of the common general knowledge in the USA, Australia, or any other jurisdiction or that this prior art could reasonably be expected to be ascertained, understood and regarded as relevant by a person skilled in the art.

SUMMARY

ICs designed for ultra-low-power applications require optimization (minimization) of both static and dynamic power dissipation. Static power dissipation is caused by steady-state current leaking. Dynamic power dissipation is caused by additional currents needed when logic circuits switch between low and high states. Reduction of dynamic power dissipation can be achieved by switching circuits no more often than strictly needed. Reduction of static power dissipation can be achieved by reducing leakage currents to the minimum at which logic gates can switch at the required speed.

In a first aspect, an embodiment of the invention includes a circuit for reducing leakage current comprising: a first metal-oxide-semiconductor (MOS) transistor 711 of a first type, the first MOS transistor 711 having a first source terminal 712 and a first body terminal 713; a first impedance 730, including at least a first resistance value, the first impedance 730 being directly coupled between the first source terminal 712 and the first body terminal 713 to create a first negative feedback loop for leakage currents, wherein the first negative feedback loop is capable of reducing an impact on leakage currents of variation of one or more parameters; a first body voltage rail 702, directly coupled to the first body terminal 713; and a first logic reference voltage rail 704, coupled with the first source terminal 712, wherein the first body voltage rail 702 and the first logic reference voltage rail 704 provide voltage levels that allow one or more other MOS transistors (in 720) of the first type to operate with reduced leakage currents.

An embodiment may further comprise a second MOS transistor 714 of a second type, the second MOS transistor 714 having a second source terminal 715 and a second body terminal 716; a second impedance 740, including at least a second resistance value, the second impedance 740 being directly coupled between the second source terminal 715 and the second body terminal 716 to create a second negative feedback loop for leakage currents, wherein the second negative feedback loop is capable of reducing an impact on leakage currents of the variation of the one or more parameters; a second body voltage rail 703, directly coupled to the second body terminal 716; a second logic reference voltage rail 705, coupled with the second source terminal 715, wherein the second body voltage rail 703 and the second logic reference voltage rail 705 provide voltage levels that allow one or more other MOS transistors of the second type (in 720) to operate with reduced leakage currents; wherein the first type MOS transistor is a PMOS transistor and the second type MOS transistor is an NMOS transistor; and wherein the first and second MOS transistor are included in a complementary metal-oxide-semiconductor (CMOS) logic gate.

In some embodiments, the first (730, 940) and second (740, 950) resistor may be trimmable and the circuit may include a memory for storing and retrieving trimming information for the trimmable resistors 940, 950.

In a second aspect, embodiments of the invention include a method 1150 for calibrating power dissipation of MOS logic circuits 900 that employ body biasing with a negative feedback loop controlled by a trimmable resistor 940 to decrease an influence of variations in temperature, supply voltage, and manufacturing, the method 1150 comprising the following steps: (a—1152) operating the MOS logic circuits at their highest expected usage and determining low (L) and high (H) values of an initial trimmable resistor search range; (b—1154) setting the trimmable resistor to a value in the range, the value being higher than L and lower than H; (c—1156) observing a MOS logic circuits switching behavior to determine if the MOS logic circuits are switching correctly; (d—1158) in response to determining that the MOS logic circuits are switching correctly, increasing the value of L to the trimmable resistor's set value to decrease the search range; (e—1160) in response to determining that the MOS logic circuits are not switching correctly, decreasing the value of H to the trimmable resistor's set value to decrease the search range; (f—1162) determining if the search range is small enough; (g) in response to determining that the search range is not small enough, repeating steps (b) through (g); (h—1164) in response to determining that the search range is small enough, determining a final calibrated value from the L value and setting the trimmable resistor to the final calibrated value; and (i—1168) storing the final calibrated value in an electronic memory.

Some embodiments may observe the CMOS logic switching behavior by presenting a logic test word of at least one bit width 1241 to at least one input of a chain of logic gates 1220 at a first time (1210, 1243); allowing the logic test word to propagate through the chain of logic gates; determining at a second time (1230, 1243) if an output response word of at least one bit width 1242 of the chain of logic gates 1220 is correctly related to the logic test word 1241; wherein the determination that the output response word is correctly related to the logic test word indicates that the CMOS logic gates switch correctly; and the determination that the output response word is not correctly related to the logic test word indicates that the CMOS logic gates do not switch correctly.

The chain of logic gates may comprise at least one dummy circuit.

Some other embodiments may observe the CMOS logic switching behavior by using a dummy chain of logic gates 1260 in a ring oscillator configuration 1250 and determining if the oscillation frequency 1261 is high enough.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which:

FIG. 1 illustrates examples of transistors used in MOS and CMOS ICs;

FIG. 2 illustrates an example of conventional CMOS logic design;

FIGS. 3A-B illustrate conventional examples of reverse body biasing for reducing leakage current and of forward body biasing for increasing speed;

DETAILED DESCRIPTION

ICs designed for ultra-low-power applications require optimization (minimization) of both static and dynamic power dissipation. Static power dissipation is caused by steady-state current leaking. Dynamic power dissipation is caused by additional currents needed when logic circuits switch between low and high states. Reduction of dynamic power dissipation can be achieved by switching circuits no more often than strictly needed. Reduction of static power dissipation can be achieved by reducing leakage currents to the minimum at which logic gates can switch at the required speed.

In some ultra-low-power designs, static power dissipation may dominate the power budget. Traditional approaches to reduce static power dissipation, including the use of power gating, custom designed ultra-low-leakage logic cells, and reverse body biasing may not be sufficient, because variations in the temperature and in the manufacturing process may force a designer to keep wide margins to ensure that gates are able to switch sufficiently fast—i.e., the designer must accept a wide variation of the static power dissipation to ensure that timing closure can be achieved for all "corner cases". Those may, for instance, span the full ranges of temperature, supply voltage, and manufacturing process variation over which a design needs to operate reliably.

Embodiments of the present invention utilize a novel self-balancing body bias technique that allows calibration of leakage currents to a minimum value at which a block of logic operates reliably, while reducing the impacts of the corner case variations.

Figure 4:
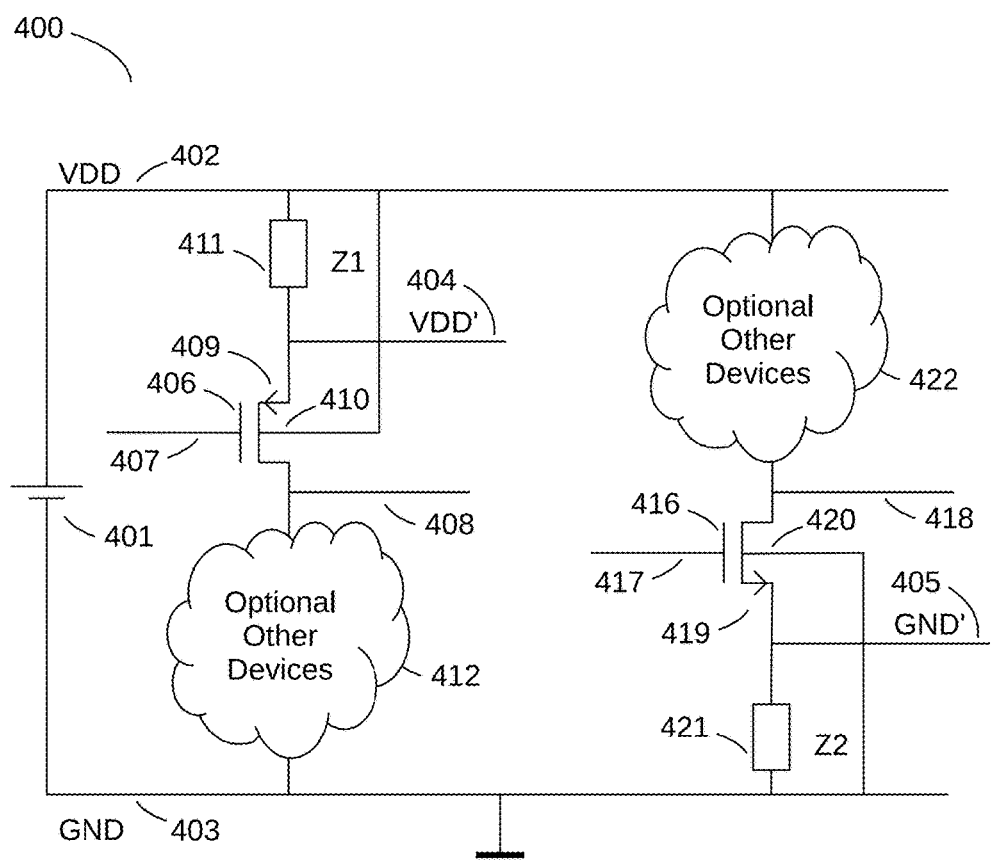
FIG. 4 illustrates two circuits with negative-feedback-controlled generation of a body bias voltage according to embodiments of the invention.

FIG. 4 illustrates two example circuits with negative-feedback-controlled generation of a body bias voltage according to embodiments of the invention. FIG. 4 shows embodiments 400, in which voltage supply 401 powers VDD rail 402 with reference to GND rail 403. Voltage supply 401 may comprise at least one of a battery, a capacitor, a charge pump, a rectifier, and a voltage regulator. FIG. 4 includes two MOS transistor examples.

A first MOS transistor, PMOS transistor 406, has an input on its gate terminal 407, and an output on its drain terminal 408. Its source terminal 409 is referenced against VDD' rail 404, and is coupled with VDD rail 402 via first impedance Z1 411. Its body terminal 410 is directly coupled with VDD rail 402. Drain terminal 408 may be coupled directly with GND rail 403 or via optional other devices 412. When gate terminal 407 receives a high voltage, for instance VDD or VDD', PMOS transistor 406 is said to be "off" and only a small leakage current $I_{pleak}$ runs via its source terminal 409 to its drain terminal 408. Leakage current $I_{pleak}$ is supplied by VDD rail 402 via first impedance Z1 411, which creates a voltage drop. Therefore, the voltage at VDD' rail 404 is lower than the voltage at VDD rail 402, creating the following reverse body bias voltage:

$$VDD-VDD'=Z1*I_{pleak}$$

Since body terminal 410 is coupled with VDD rail 402, PMOS transistor 406 has a reverse body bias voltage of $Z1*I_{pleak}$, which in turn reduces the leakage current $I_{pleak}$. Should, under the influence of a temperature variation, or because of a variation in the manufacturing process, leakage current $I_{pleak}$ tend to become larger, then first impedance Z1 411 will counter such a variation by reducing $I_{pleak}$. Embodiments of the invention use this negative feedback mechanism to cancel variations in leakage current $I_{pleak}$ caused by variations such as caused by the temperature, the supply voltage, the manufacturing process, and other parameters, including, but not limited to, transistor design parameters such as determined by a transistor's geometry.

Similarly, NMOS transistor 416 has an input on its gate terminal 417, and an output on its drain terminal 418. Its source terminal 419 is referenced against GND' rail 405, and is coupled with GND rail 403 via impedance Z2 421. Its body terminal 420 is directly coupled with GND rail 403. Drain terminal 418 may be coupled directly with VDD rail 402 or via optional other devices 422. When gate terminal 417 receives a low voltage, for instance GND or GND', NMOS transistor 416 is said to be "off" and only a small leakage current $I_{nleak}$ runs via its drain terminal 418 to its source terminal 419. Leakage current $I_{nleak}$ is supplied to GND rail 403 via impedance Z2 421, which creates a voltage drop. Therefore, the voltage at GNC' rail 405 is higher than the voltage at GND rail 403, creating the following reverse body bias voltage:

$$GND-GND'=-Z2*I_{nleak}$$

Similar like PMOS transistor 406 with impedance Z1 411, impedance Z2 421 provides a negative feedback mechanism for leakage current $I_{nleak}$ in NMOS transistor 416. Should, under the influence of a temperature variation, or because of a variation in the manufacturing process, leakage current $I_{nleak}$ tend to be larger, then impedance Z2 421 will counter such a variation by reducing $I_{nleak}$. Embodiments of the invention use this negative feedback mechanism to cancel variations in leakage current $I_{nleak}$ caused by variations such as caused by the temperature, the supply voltage, the manufacturing process, and other parameters, including, but not limited to, transistor design parameters such as determined by a transistor's geometry.

Embodiments of the invention may couple source terminals 409 and/or 419 directly to VDD' rail 404 and GND' rail 405, respectively, wherein these rails form first and second logic reference voltage rails for the source terminals of other PMOS and NMOS transistors, respectively, and wherein the body terminals of those transistors are directly coupled to VDD rail 402 and GND rail 403, respectively. Further embodiments of the invention may buffer the voltage at source terminal 409 to generate a voltage VDD' for VDD' rail 404, and/or buffer the voltage at source terminal 419 to generate a voltage GNC' for GNC' rail 405. In those embodiments, again, VDD' rail 404 forms a first logic reference voltage rail for the source terminals of other PMOS transistors, whose body terminals are directly coupled to VDD rail 402, and GNC' rail 405 forms a second logic reference voltage rail for the source terminals of other NMOS transistors, whose body terminals are directly coupled to GND rail 403.

Whereas in some embodiments PMOS transistor 406 and NMOS transistor 416 could just be connected as diodes (i.e. gate terminal 407 coupled to source terminal 409 with drain terminal 408 coupled to GND, and gate terminal 417 coupled to source terminal 419 with drain terminal 418 coupled to VDD), in other embodiments PMOS transistor 406 and NMOS transistor 416 could each be part of a logic gate, including an inverter, NAND gate, NOR gate, or any other gate used in the art, and in yet other embodiments PMOS transistor 406 and NMOS transistor 416 could be part of an analog or mixed-signal circuit.

Figures 5A, 5B, 5C, 5D, 5E, 5F:
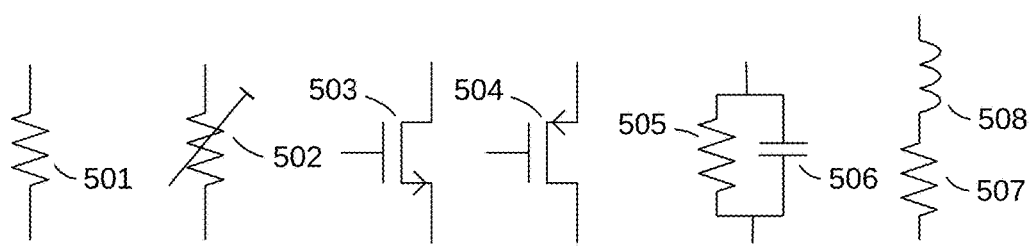
FIGS. 5A-F illustrate examples of a feedback impedance according to embodiments of the invention.

FIGS. 5A-F illustrate examples of a feedback impedance Z1 411 or Z2 421 according to embodiments of the invention. FIG. 5A shows that Z1 or Z2 could be as simple as a resistor 501. Resistor 501 is capable of generating the voltage caused by a leakage current and necessary for the negative feedback reverse body biasing of PMOS transistor 406 and NMOS transistor 416, as well as any other PMOS and NMOS transistors whose source terminals are coupled with VDD' rail 404 and GNC' rail 405, respectively.

FIG. 5B illustrates that impedances Z1 411 and/or Z2 421 may include trimmable resistor 502. For example, in silicon integrated circuits, MOS transistor leakage currents correlate to the transistor's capability to switch fast. The faster a transistor is, the more leakage it exhibits. A trimmable resistor is a resistor whose resistance value can be controlled externally. For example, the resistor may be controlled by a digital number (a digitally-controllable resistor) or an analog voltage (an analog-controllable resistor), or a resistor may be trimmed physically by altering its shape or by interrupting fuses, or by any other method known in the art. Thus, trimmable resistor 502 allows for calibrating a circuit at a minimum leakage current for which the transistors remain fast enough to keep switching at a speed required by a design and its application.

FIGS. 5C-D illustrate that impedances Z1 411 and/or Z2 421 may include NMOS transistor 503 or PMOS transistor 504, whose drain-to-source impedance is controllable by an analog voltage on its gate terminal.

FIG. 5E illustrates that impedances Z1 411 and/or Z2 421 may include not just resistor 505, but also capacitor 506. Capacitor 506 may average transients in currents running through resistor 504, and thereby reduce noise and high-frequency instabilities in the reverse body bias voltage.

FIG. 5F illustrates that impedances Z1 411 and/or Z2 421 may include not just resistor 507, but also inductor 508. Inductor 508 may serve to emphasize the reverse body bias for certain high-frequency currents. This can help minimize peak currents. Inductor 508 can further be used to stabilize the negative feedback loop even though it may have a high bandwidth.

The illustrations in FIGS. 5A-F serve as examples, showing circuits that may be included in impedances Z1 411 and/or Z2 421. However, these examples may not be interpreted as limiting in any way. In fact, embodiments may include any combination of the devices shown in FIGS. 5A-F, and each of the devices may be trimmable and/or controllable.

Figure 6:
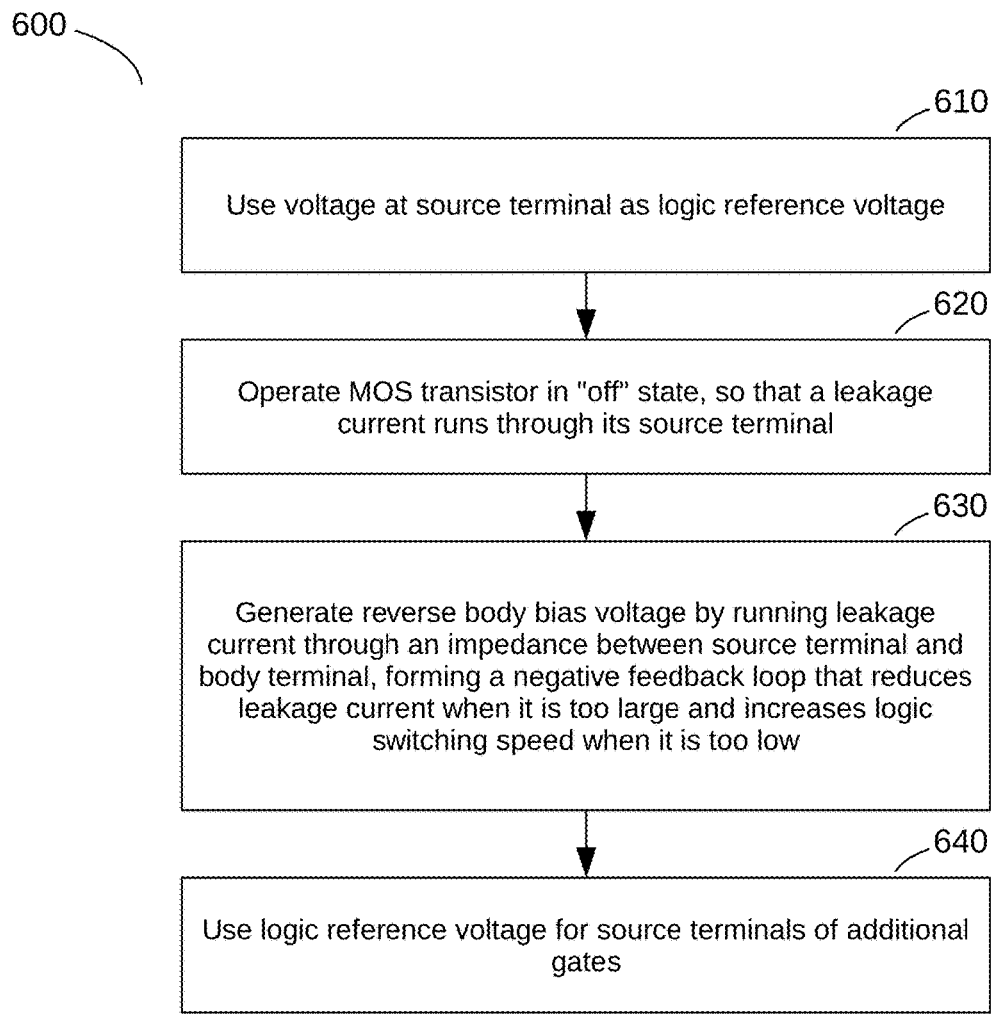
FIG. 6 illustrates an example method to reduce static power dissipation in a circuit including a MOS transistor according to an embodiment of the invention.

FIG. 6 illustrates an example method 600 to reduce static power dissipation in a circuit including a MOS transistor according to an embodiment of the invention. Method 600 can best be understood with reference to FIG. 4, where a MOS transistor can either be PMOS transistor 406 or NMOS transistor 416. The method will be explained with reference to PMOS transistor 406.

Method 600 may apply to a circuit with a logic gate (comprising PMOS transistor 406 and optional other devices 412). The logic gate comprises a first MOS transistor (406) embedded in a first body (body terminal 410 is shown). The first MOS transistor has a first source terminal (409) and a first body terminal (410). The circuit further includes a first impedance (411), coupled between the first source terminal (409) and the first body terminal (410). The method comprises the following steps.

Step 610—using a voltage (VDD') at the first source terminal (409) as a first logic reference voltage (404). While the battery supplies VDD rail 402, this rail no longer functions as a logic reference. Instead VDD rail 402 serves only as the voltage reference for the body of PMOS transistor 406, coupled to it via body terminal 410, whereas VDD' rail 404 now functions as a logic reference.

Step 620—operating the MOS transistor (406) in an "off" state, wherein a first leakage current runs through the first source terminal (409). Generally, to operate PMOS transistor 406 in the "off" state, its gate terminal 407 is provided with a high voltage. Such a high voltage may be obtained by coupling gate terminal 407 to source terminal 409 (and thereby to logic reference voltage 404), or by coupling gate terminal 407 to VDD rail 402, or to any other circuit element that continuously or temporarily supplies a logic high voltage.

Step 630—generating a first reverse body bias voltage (VDD 402-VDD' 404) by running the first leakage current through the first impedance (411). This forms a negative feedback loop. The first reverse body bias voltage is proportional to the first leakage current and a value of the first impedance (according to Ohm's law, V=I*R). But, the first reverse body bias voltage reduces the first leakage current when the first leakage current is larger than a stable value and increases the first leakage current when the first leakage current is smaller than the stable value.

Further embodiments may incorporate step 640 as follows.

Step 640—using the first logic reference voltage (404), either directly or indirectly, as a logic reference voltage for additional source terminals. It is possible to share the logic reference voltage (404) directly with source terminals of other PMOS devices in other logic gates, or to buffer the logic reference voltage (404), for example using a source follower, which may reduce switching noise from such other logic gates. Should PMOS transistor 406 not continually be in the "off" state, then yet further embodiments may sample and hold logic reference voltage 404.

Figure 7A:
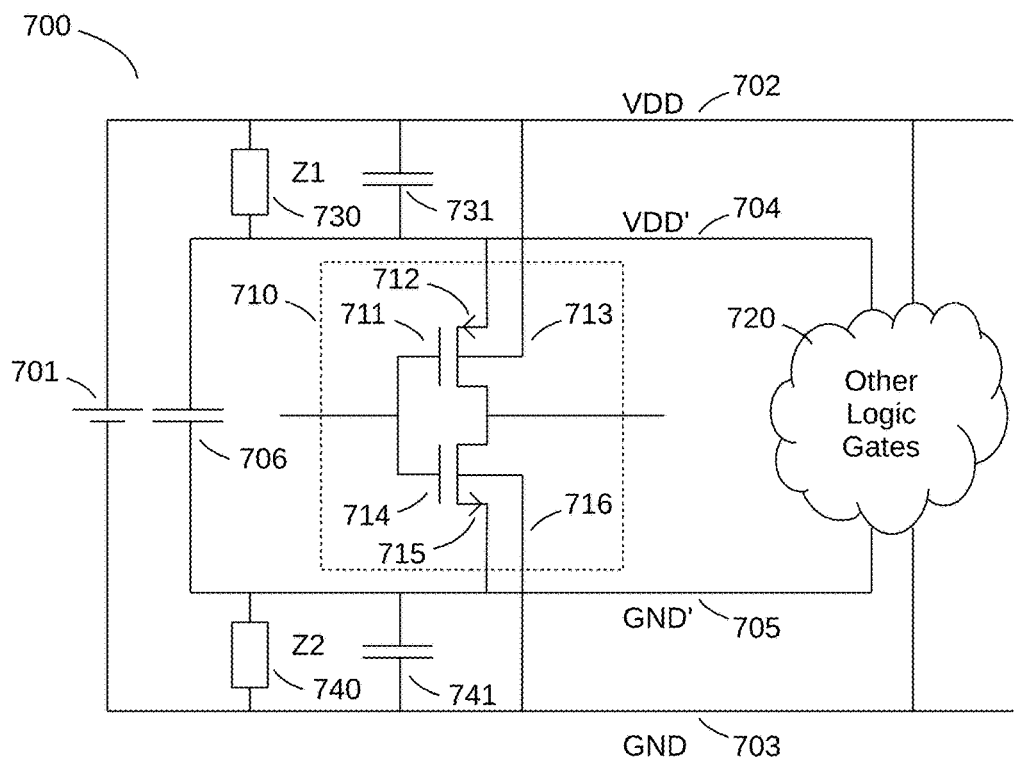
FIGS. 7A-B illustrate example CMOS logic circuits with controlled static power dissipation according to embodiments of the invention.
Figure 7B:
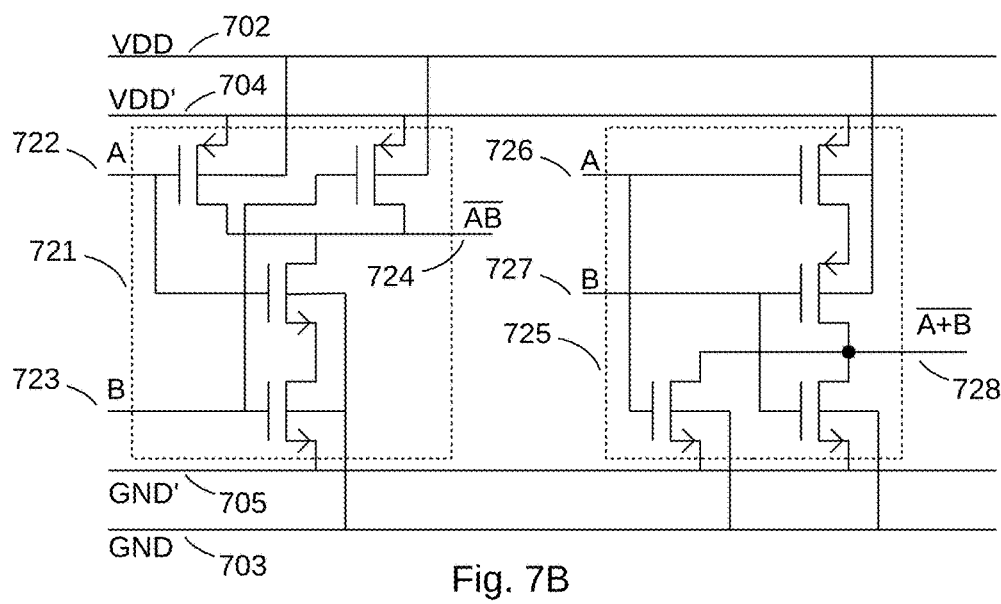

FIGS. 7A-B illustrate example CMOS logic circuits 700 with controlled static power dissipation according to embodiments of the invention. Example embodiment 700 shows voltage supply 701 that powers VDD rail 702 with reference to GND rail 703. Voltage supply 701 may comprise at least one of a battery, a capacitor, a charge pump, a rectifier, and a voltage regulator.

Inverter 710, an example CMOS logic gate, comprises PMOS transistor 711 and NMOS transistor 714. MOS transistors 711 and 714 have their gate terminals coupled to an inverter 710 input, and their drain terminals coupled to an inverter 710 output. PMOS transistor 711 has its source terminal 712 coupled to VDD' rail 704 and its body terminal 713 coupled to VDD rail 702. NMOS transistor 714 has its source terminal 715 coupled to GNC' rail 705 and its body terminal 716 coupled to GND rail 703. Other logic gates 720 likewise include PMOS transistors with source terminals coupled to VDD' rail 704 and body terminals coupled to VDD rail 702, and NMOS transistors with source terminals coupled to GNC' rail 705 and body terminals coupled to GND rail 703. VDD' rail 704 is coupled with VDD rail 702 via first impedance Z1 730 and first decoupling capacitor 731. GNC' rail 705 is coupled with GND rail 703 via second impedance Z2 740 and second decoupling capacitor 741. Third decoupling capacitor 706 is coupled between VDD' rail 704 and GNC' rail 705.

As discussed with reference to FIGS. 5A-F, first and second impedances Z1 730 and Z2 740 may each comprise one of a variety of circuits, at least including a resistor or other resistive element to create a reverse body bias voltage. First and second decoupling capacitors 731 and 741 reduce noise that may result from switching inverter 710 and other logic gates 720 between low and high states. Third decoupling capacitor 706 further reduces this noise and generally smooths logic references VDD' and GNC', which act as derived supplies.

When an input signal of inverter 710 is high, PMOS transistor 711 will be in the "off" state and NMOS transistor 714 will be in an "on" state. The transistor in the "off" state will determine the inverter's leakage, in this case PMOS transistor 711. Its geometry, its source-to-gate voltage VGS, its body-to-source voltage VBS, its threshold voltage Vt, and its drain-to-source voltage VDS will all determine the size of the leakage current. NMOS transistor 714 has no impact as it simply conducts and passes the PMOS transistor 711 leakage to GNC' rail 705. Conversely, when the input signal of inverter 710 is low, PMOS transistor 711 will be in the "on" state and NMOS transistor 714 will be in the "off" state. In this case, NMOS transistor 714 will determine the size of the leakage current and PMOS transistor 711 will simply pass it on. As long as inverter 710 is in a steady state, the total current passing through it will be either the PMOS transistor 711 leakage current, or the NMOS transistor 714 leakage current.

For gates with other topologies, see FIG. 7B, the leakage currents may be different than in a simple inverter gate. For instance, NAND gate 721 may comprise two NMOS transistors in series, and two PMOS transistors in parallel. Generally, transistors in series will exhibit lower leakage than transistors in parallel. But the leakage also depends on whether one or both of the transistors that are in series or that are in parallel are in the "off" state. Two-input NAND gate 721 has 4 different logic states, dependent on a combination of input signals. Therefore, the total leakage current of a NAND gate may have 4 different values, one for each state. In general, a gate that can be in one of N different states may exhibit N different values for its leakage current.

Other logic gates 720 in FIG. 7A may include inverters, similar to inverter 710, NAND gates, similar to NAND gate 721 in FIG. 7B, NOR gates, similar to NOR gate 725, and generally any other logic gates used in the art that have separate terminals for PMOS body reference and logic reference voltages, and separate terminals for NMOS body reference and logic reference voltages. NAND gate 721 has inputs A 722 and B 723 and output $\overline{AB}$ 724. It includes 2 PMOS and 2 NMOS transistors. All transistors have their body terminal coupled to either VDD rail 702 or GND rail 703. Both PMOS transistors have their source terminal coupled to VDD' rail 704, but only one of the NMOS transistors has its source terminal coupled to GNC' rail 705. Similarly, NOR gate 725 has inputs A 726 and B 727, and output $\overline{A+B}$ 728. NOR gate 727 also includes 2 PMOS and 2 NMOS transistors. Both NMOS transistors have their body terminal coupled to GND rail 703 and their source terminals coupled to GNC' rail 705. Both PMOS transistors have their body terminal coupled to VDD rail 702, but only one of the PMOS transistors has its source terminal coupled to VDD' rail 704.

The embodiments generate reverse body bias voltages over first impedance Z1 730 and second impedance Z2 740 proportional to the total leakage current occurring in inverter 710 and other logic gates 720 in example circuit 700. More particularly, the total leakage current relates to those PMOS and NMOS transistors that are in an "off" state at any moment in time, as determined by signals on the inputs of those gates, the particular topology of the gates, geometric parameters of the transistors in the gates, etc. The total current through first impedance Z1 730 and second impedance Z2 740 also includes dynamic switching currents. Assuming that a majority of gates in example circuit 700 switches states regularly and in a fairly constant fashion, statistics will reduce the variation of the total current towards an average value, although it still may vary over time.

First and second decoupling capacitors 731 and 741 average out these effects over time, and serve to provide stability on VDD' rail 704 and GNC' rail 705. Resistors or resistances included in first impedance Z1 730 and second impedance Z2 740 generate reverse body bias voltages proportional to the average over time of the total leakage current occurring in example circuit 700, plus all dynamic switching currents due to logic gates being switched and/or switching. Because of the reverse body bias negative feedback loops, explained in reference to FIG. 4, the embodiments cancel variations in leakage current due to variations such as the manufacturing process, temperature, voltage, and other parameters that affect the magnitude of the transistor leakage currents.

Figure 8:
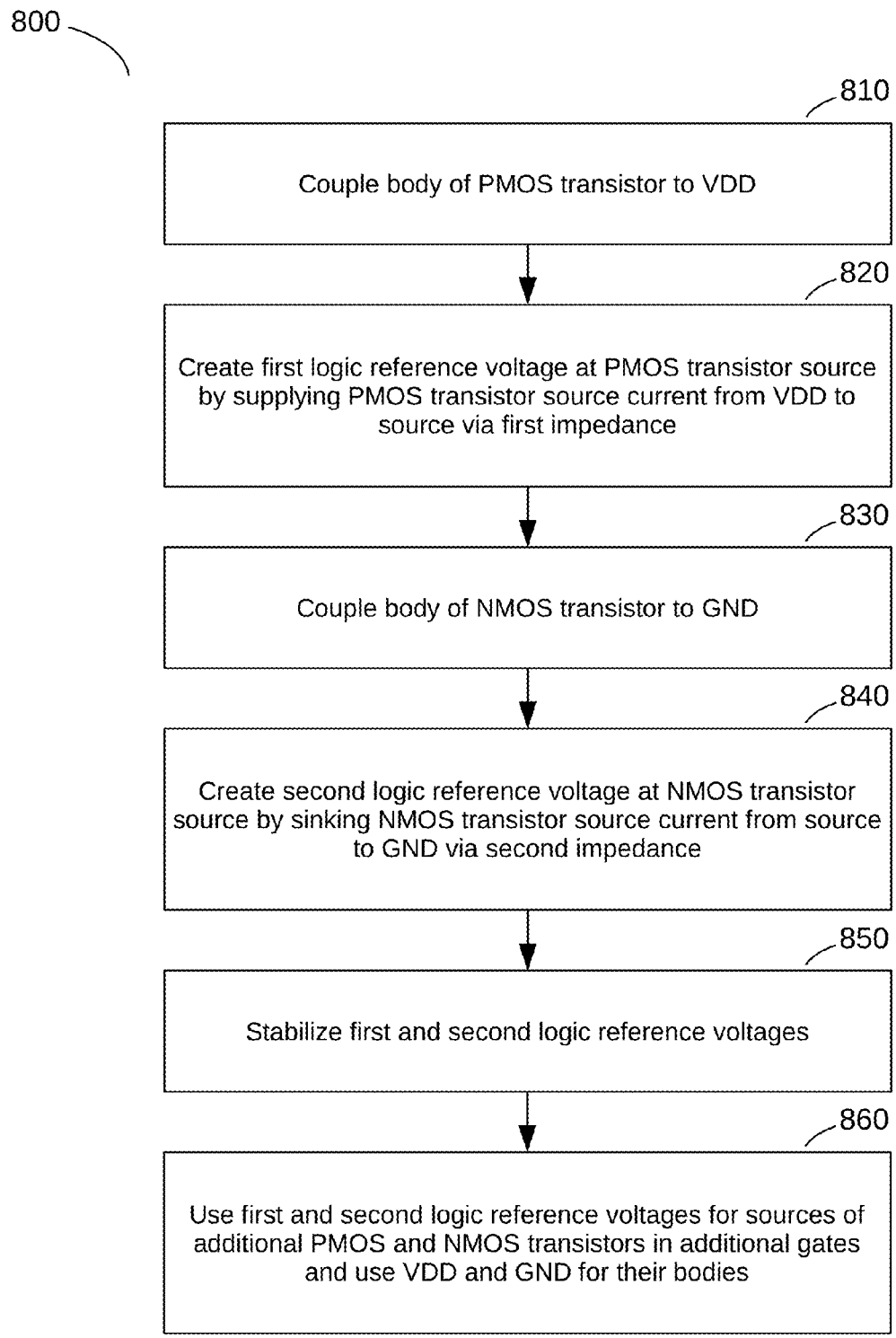
FIG. 8 illustrates an example method to control static power dissipation in CMOS logic according to an embodiment of the invention.

FIG. 8 illustrates an example method 800 to control static power dissipation in CMOS logic according to an embodiment of the invention. The method can be understood with reference to FIG. 7A, wherein inverter 710 is shown as the method's CMOS logic gate. The CMOS gate (710) comprises a PMOS transistor (711) embedded in a first body (body terminal 713 is shown) and an NMOS transistor (714) embedded in a second body (body terminal 716 is shown). The method comprises the following steps.

Step 810—coupling the first body (713) directly to a first supply voltage (702). The body of a PMOS transistor may be an N-well, for example, that should be connected with the highest voltage available on the chip.

Step 820—creating a first logic reference voltage (VDD' 704) that is lower than the first supply voltage (VDD 702) by supplying a source current of the PMOS transistor (711) through a first impedance (730). The first impedance (730) is coupled between the first supply voltage (VDD 702) and the PMOS transistor source terminal 712. The first logic reference voltage (VDD' 704) can be observed between the first impedance (730) and the PMOS transistor source, at source terminal 712. VDD' 704 is lower than VDD 702, since PMOS transistor 711's source current runs via Z1 (730), PMOS transistor 711, NMOS transistor 714, and second impedance 740 to GND 703. Since practical impedances, such as the examples shown in FIGS. 5A-F, are positive, a voltage over Z1 is positive, and thus VDD' 704 is lower than VDD 702.

Step 830—coupling the second body (716) directly to a first ground reference (GND 703). The body of an NMOS transistor may be the substrate bulk, for example, and should be connected to the lowest voltage available on the chip.

Step 840—creating a second logic reference voltage (GNC' 705) that is higher than the first ground reference (GND 703) by sinking a source current of the NMOS transistor (715) through the second impedance (740). The second impedance (740) is coupled between the first ground reference (703) and the NMOS transistor source terminal 715. The second logic reference voltage (GNC' 705) can be observed between the second impedance (740) and the NMOS transistor source, at source terminal 715. GNC' 705 is higher than GND 703, since NMOS transistor 714's source current runs via second impedance Z2 to GND 703. Since practical impedances, such as the examples shown in FIGS. 5A-F, are positive, a voltage over Z2 is positive, and thus GNC' 705 is higher than GND 703.

Step 850—stabilizing the first logic reference voltage (VDD' 704) and the second logic reference voltage (GNC' 705) to values in between the first supply voltage (VDD 702) and the first ground reference (GND 703) for a time longer than an average switching time of the PMOS and NMOS transistors. In FIG. 7A, VDD' 704 is stabilized by decoupling capacitor 731, and GNC' 705 is stabilized by decoupling capacitor 741. Embodiments may perform stabilization in other ways, for example by a single decoupling capacitor coupled between VDD' and GNC', or by applying buffering, or sample and hold, or by any other way known in the art.

Further embodiments may incorporate step 860, as follows:

Step 860—using the first and the second logic reference voltages (704 and 705) for sources of additional PMOS and NMOS transistors in additional gates (720). The additional gates (720) have body terminals of PMOS transistors coupled to VDD 702, and body terminals of NMOS transistors coupled to GND 703.

The example embodiment 700 in FIG. 7A-B can work fine in situations where leakage current, if uncontrolled, dominates dynamic power dissipation, and where dynamic currents don't vary much over time. However, ultra-low-power circuits usually implement various sleep and activity modes to reduce power in logic blocks that are less active than other blocks. Strategies may include power gating, clock gating, changes in clock frequency, etc., to reduce static and dynamic power in various blocks. Whereas each logic block could be implemented using the embodiment illustrated in FIG. 7A-B, further embodiments of the invention offer further opportunities to reduce power dissipation.

Figure 9:
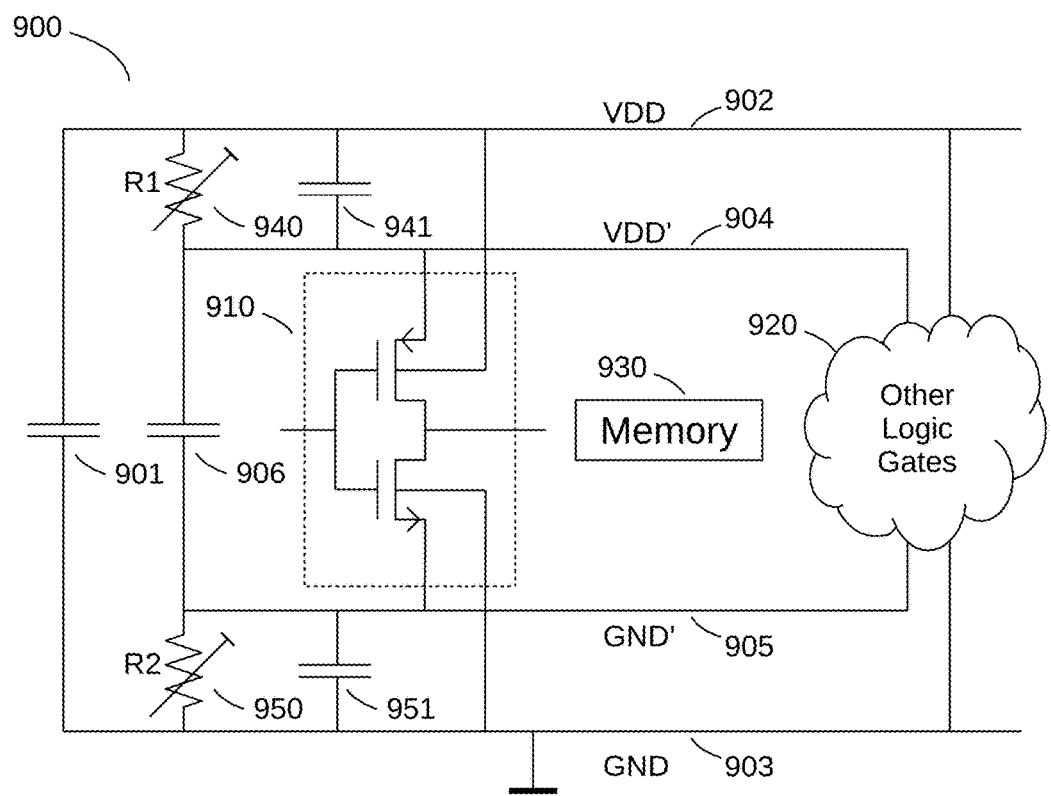
FIG. 9 illustrates an example adaptable system for reducing logic circuit leakage currents according to an embodiment of the invention.

FIG. 9 illustrates an example adaptive system 900 for reducing logic circuit leakage currents according to an embodiment of the invention. Voltage supply 901 powers VDD rail 902 with reference to GND rail 903. Voltage supply 901 may comprise at least one of a battery, a capacitor, a charge pump, a rectifier, and a voltage regulator. If it comprises a capacitor, as drawn, the capacitor may be part of a power harvesting system, such as for example used in a radio frequency ID (RFID) tag.

System 900 includes inverter 910, and other logic gates 920, including PMOS transistors whose source terminals are coupled with VDD' rail 904 and whose body terminals are coupled with VDD rail 902, and including NMOS transistors whose source terminals are coupled with GNC' rail 905 and whose body terminals are coupled with GND rail 903. VDD' rail 904 is coupled with VDD rail 902 via first trimmable resistor R1 940 and first decoupling capacitor 941. GNC' rail 905 is coupled with GND rail 903 via second trimmable resistor R2 950 and second decoupling capacitor 951. Third decoupling capacitor 906 is coupled between VDD' rail 904 and GNC' rail 905. System 900 further includes memory 930.

System 900 of FIG. 9 works in a similar fashion as example circuit 700 of FIG. 7A. Memory 930 allows for storing and retrieving trimming information for first and second trimmable resistors R1 940 and R2 950. The embodiment of system 900 offers several advantages over embodiments with fixed body bias resistors. The embodiment allows calibration for the lowest static power dissipation in various power saving modes, including, but not limited to, sleep, standby, low activity, high activity, low performance, and high performance. The embodiment may store calibration information for each defined power saving mode in memory 930. In anticipation of, or at the beginning of, a power saving mode change, the embodiment retrieves relevant calibration information from memory 930, and uses this information to set resistance values for first and second trimmable resistors R1 940 and R2 950. The reverse body bias voltages over first and second trimmable resistors R1 940 and R2 950 change accordingly, allowing all gates (inverter 910 and other logic gates 920) to operate with just enough speed and just enough margin to perform their tasks at hand. Static power dissipation is thus reduced to the minimum achievable in that mode, and when performance or activity levels change, static power dissipation is optimized again. In each of the power saving modes, the negative feedback in the reverse body bias provided by first and second trimmable resistors R1 940 and R2 950 allows for tight margins in setting the body bias voltages, since variations due to manufacturing process and temperature have a much reduced impact.

First and second decoupling capacitors 941 and 951 reduce noise that may result from switching inverter 910 and other logic gates 920 between low and high states, and they help even out variations in leakage current due to gates having somewhat different leakage currents dependent on the state in which they are, as explained in paragraph [76]. Third decoupling capacitor 906 further reduces this noise and generally smooths logic references VDD' and GNC', which act as derived supplies.

Figure 10:
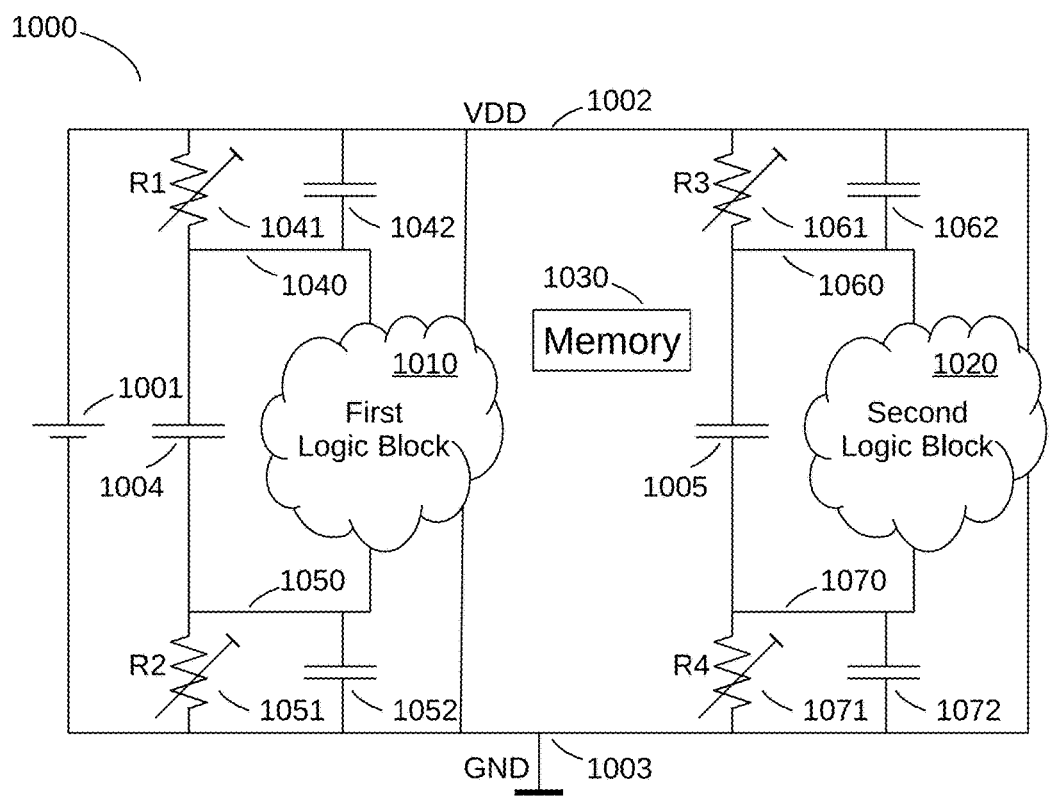
FIG. 10 illustrates a multiple block logic system with controlled static power dissipation according to an embodiment of the invention.

FIG. 10 illustrates a multiple block logic system 1000 with controlled static power dissipation according to an embodiment of the invention. System 1000 includes voltage supply 1001 powering VDD rail 1002 and GND rail 1003, to operate first logic block 1010 and one or more other logic blocks. For simplicity, only second logic block 1020 is shown. System 1000 further includes memory 1030. Voltage supply 1001 may comprise at least one of a battery, a capacitor, a charge pump, a rectifier, and a voltage regulator.

First logic block 1010 and second logic block 1020 may each comprise sequential and combinatorial logic using CMOS gates whose body terminals are coupled to VDD rail 1002 and GND rail 1003. However, each logic block may have its own characteristics. For example, first logic block 1010 may operate at a low-frequency clock and switch only occasionally, even when in full operating mode, whereas second logic block 1020 may operate at a much higher frequency clock and it may switch intensely when in full operating mode. First logic block 1010 and second logic block 1020 may be in full operating mode at different times and/or in sleep mode at different times, and they may even have different numbers of power saving modes.

Embodiments may change power-saving modes in first logic block 1010 and second logic block 1020 at different times, in different modes, and for different performance characteristics. Therefore, first logic block 1010 has its own first and second logic reference voltage rails 1040 and 1050, respectively, stabilized by first reference decoupling capacitor 1004, and negative feedback loops comprising first trimmable resistor 1041 and first decoupling capacitor 1042, and second trimmable resistor 1051 and second decoupling capacitor 1052. Second logic block 1020 has its own third and fourth logic reference voltage rails 1060 and 1070, respectively, stabilized by second reference decoupling capacitor 1005, and negative feedback loops comprising third trimmable resistor 1061 and third decoupling capacitor 1062, and fourth trimmable resistor 1071 and fourth decoupling capacitor 1072. Embodiments store trim setting values for trimmable resistors 1041, 1051, 1061 and 1071, for each relevant power saving mode, in memory 1030. When a change in power saving mode occurs for first logic block 1010, the embodiment retrieves the relevant trim setting values from memory 1030 and applies them to first and second trimmable resistors 1041 and 1051. When a change in power saving mode occurs for second logic block 1020, the embodiment retrieves the relevant trim setting values from memory 1030 and applies them to third and fourth trimmable resistors 1061 and 1071.

Embodiments may trim resistors R1 940 and R2 950 if FIG. 9, or trimmable resistors 1041, 1051, 1061 and 1071 in FIG. 10, in several different ways. Calibration (trimming) may be "offline" or "online". Embodiments may perform offline calibration during an IC's production test, or at power-up, or at idle times when an IC is not expected to perform real work. They may perform online calibration when the IC is active.

Offline calibration may rely on the IC temporarily failing, either by exhibiting too much static power dissipation, or by gates failing to switch fast enough to guarantee correct functionality. In an embodiment, calibration may start from a non-acceptable setting (leakage too high, or circuits switching too slowly), and stepwise change body bias until the setting becomes acceptable. In another embodiment, calibration may start from an acceptable setting, and stepwise change body bias until the setting is no longer acceptable, and then step back to restore the previous setting. In yet another embodiment, calibration may include a binary search to find the optimum point. A binary search finds the optimum point by starting at a mid-range setting and measuring if the result is acceptable. Based on the result, the search range is reduced to one side of the mid-range point, and the procedure is repeated on the smaller search range, until the search range is small enough. In yet further embodiments, calibration may include a variation of the binary search, many of which are well-known in the art.

Figure 11A:
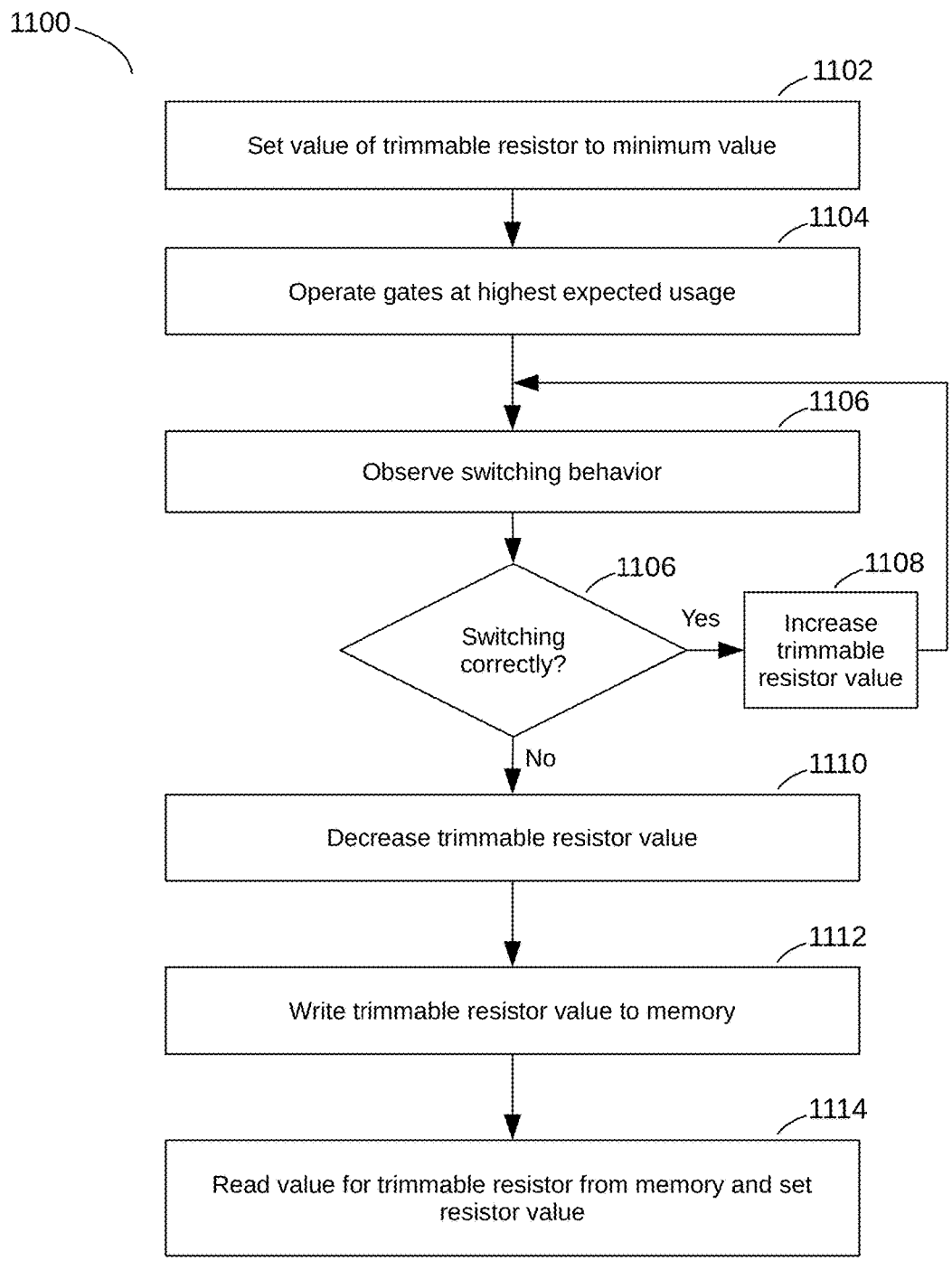
FIG. 11A-B illustrate example methods for calibrating power dissipation of ultra-low-power integrated circuits according to embodiments of the invention.
Figure 11B:
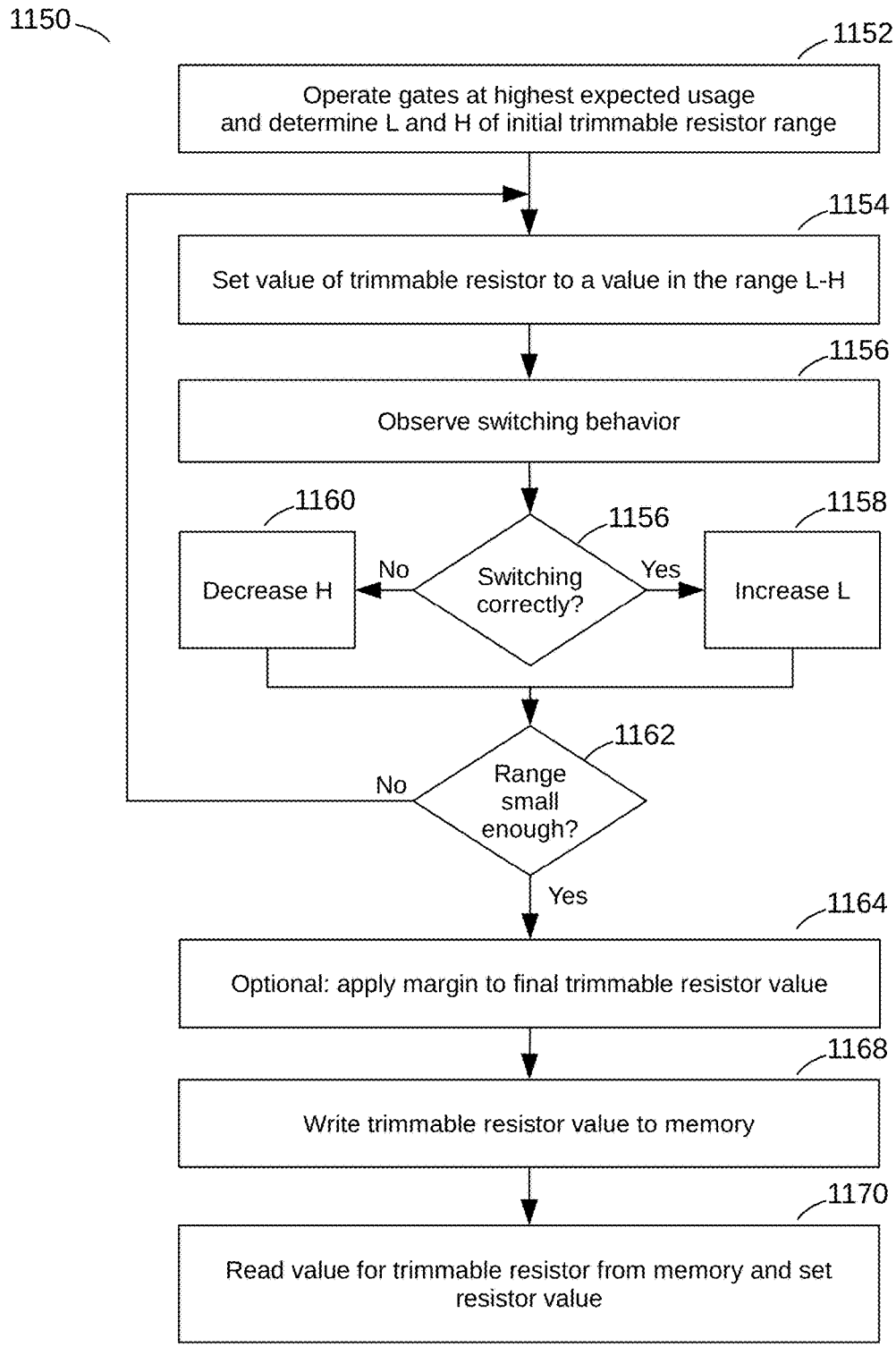

FIG. 11A-B illustrate example methods 1100 and 1150 for calibrating power dissipation of MOS logic circuits according to embodiments of the invention. The MOS logic circuits employ body biasing (forward or reverse) with a negative feedback loop to decrease the influence of variations in temperature, manufacturing, supply voltage, and other corner cases. Method 1100 in FIG. 11A, performing a linear search, includes the following steps, which are illustrated with reference to FIG. 9.

Step 1102—operating the MOS logic circuits (910, 920) at a point of highest static power dissipation. The highest static power dissipation is achieved by setting a trimmable resistor (R1 940, R2 950) at its lowest value. This reduces the reverse body bias voltage and therefore increases the leakage currents of MOS logic circuits 910-920 to their highest values.

Step 1104—operating the MOS logic circuits at a highest expected usage. During the calibration procedure, MOS logic circuits 910-920 are switched at a highest level of activity that is relevant for a mode for which the calibration is performed. For example, for a sleep mode the highest level of activity may be low: a percentage of gate changes per clock and a clock frequency may be at a minimum; whereas for a high-performance mode the highest level of activity may be very high: the percentage of gate changes per clock and the clock frequency may be at a maximum.

Step 1106—observing a MOS logic circuits 910-920 switching behavior to determine if the MOS logic circuits are switching correctly. If they are, there may still be margin to decrease their performance and their leakage. If they are no longer switching correctly, trimming has gone too far, and leakage must be increased to restore minimum performance.

Step 1108—in response to determining that the MOS logic circuits 910-920 are switching correctly, reducing the static power dissipation operating point such that the MOS logic circuits dissipate less static power, and repeating step 906. For system 900 in FIG. 9, the embodiment reduces the static power dissipation operating point by increasing the value of the trimmable resistor (R1 940 or R2 950). Increasing the resistor value will increase the reverse body bias voltage, and therefore decrease the leakage and decrease the switching speeds of MOS logic circuits 910-920.

Step 1110—in response to determining that the MOS logic circuits 910-920 are no longer switching correctly, increasing the static power dissipation operating point such that the MOS logic circuits dissipate more static power and switch faster. Decreasing the value of the trimmable resistor (R1 940 or R2 950) to its previous value will increase the leakage, and therefore the static power dissipation, and will restore the switching speed of MOS logic circuits 910-920.

Step 1112—storing a trim setting value in an electronic memory, wherein the trim setting value is representative for a value of the increased static power dissipation operating point. For system 900 in FIG. 9, the embodiment writes the value of the trimmable resistor (R1 940 or R2 950) to memory 930.

In a further embodiment, method 1100 may include the following additional step.

Step 1114—reading the trim setting value from the electronic memory, and operating the MOS logic circuits at a point of static power dissipation represented by the trim setting value.

Method 1150 in FIG. 11B, to perform either a binary search or a linear search, includes the following steps, which are illustrated with reference to FIG. 9.

Step 1152—operating gates at their highest expected usage (see step 1104) and determining low (L) and high (H) values of the initial trimmable resistor (R1 940 or R2 950) range. At the highest resistance value (related to H), a reverse bias voltage is the largest, and therefore current leakage and switching speeds are the lowest. At the lowest resistance value (related to L), the reverse bias voltage is the smallest, and therefore current leakage and switching speeds are the highest. At the L point, logic should switch correctly, but current leakage may be too high. At the H point, current leakage is minimized, but logic is presumably no longer switching correctly. The binary search is for the highest resistance value at which the gates still operate fast enough.

Step 1154—set the trimmable resistor (R1 940 or R2 950) to a value in the range. Some embodiments performing a binary search may set the value midway between L and H. Other embodiments performing a linear search may set the value a small amount higher than L or smaller than H.

Step 1156—observing a MOS logic circuits 910-920 switching behavior to determine if the MOS logic circuits are switching correctly.

Step 1158—in response to determining that the MOS logic circuits 910-920 are switching correctly, increase the value of L to the current setting of the trimmable resistor to reduce the search range to from the increased L value to the H value.

Step 1160—in response to determining that the MOS logic circuits 910-920 are not switching correctly, decrease the value of H to the current setting of the trimmable resistor to reduce the search range from L to the decreased H value.

Step 1162—determining if the range is small enough. Some embodiments may calculate the difference between current H and L values. Other embodiments may count a number of iterations. Embodiments performing a linear search know that their search range is small enough the first time a change has occurred in the outcome of step 1156. In response to determining that the range is not small enough, repeat steps 1154-1162.

Step 1164—in response to determining that the range is small enough, some embodiments may apply a margin to determine a final calibrated value for the trimmable resistor. Those embodiments may determine that the final calibrated value equals L minus the margin. Other embodiments may just take L as the final calibrated value.

Step 1168—storing the final calibrated value in an electronic memory. For system 900 in FIG. 9, the embodiment writes the value of the trimmable resistor (R1 940 or R2 950) to memory 930.

In a further embodiment, method 1150 may include the following additional step.

Step 1170—reading the final calibrated value from the electronic memory, and operating the MOS logic circuits at a point of static power dissipation represented by the final calibrated value.

Figure 12A:
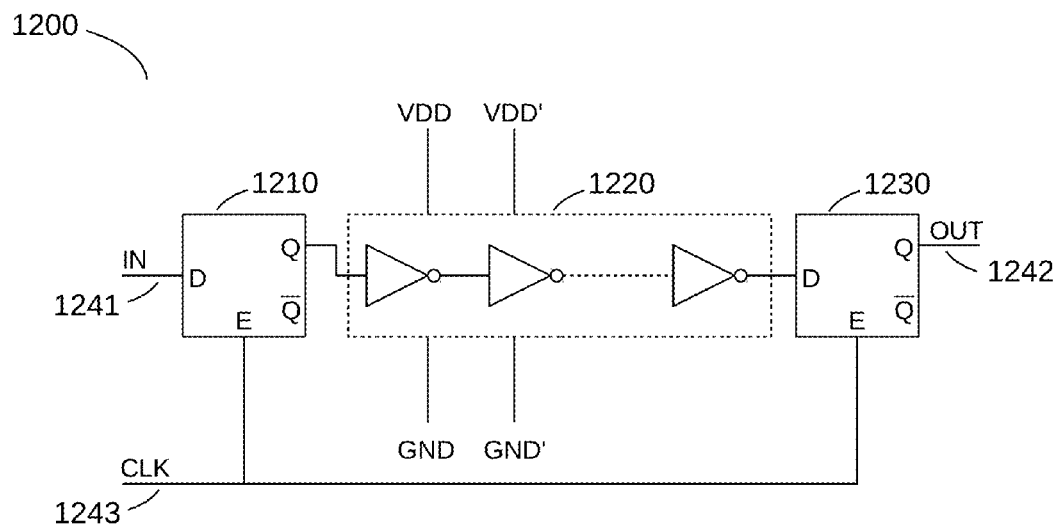
FIGS. 12A-B illustrate example circuits to observe timing behavior of MOS logic according to embodiments of the invention.
Figure 12B:
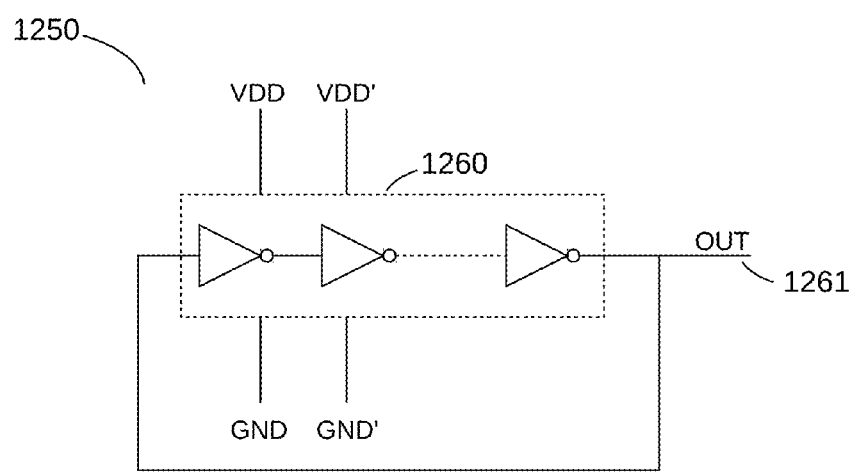

FIGS. 12A-B illustrate example circuits 1200 and 1250 to observe timing behavior of MOS logic according to embodiments of the invention. Both offline and online calibration methods of a block of logic may use a dummy circuit to determine if logic gates are switching correctly. FIG. 12A illustrates a dummy circuit 1200 where a logic chain 1220 includes a signal path that is longer than a critical path of the block of logic represented by dummy circuit 1200. An input of logic chain 1220 is coupled with an output of latch 1210. An output of logic chain 1220 is coupled with an input of latch 1230. Latches 1210 and 1230 are enabled by CLK signal 1243. An input signal can be presented to latch 1210 input 1241, and an output signal can be obtained from latch 1230 output 1242. Logic gates in logic chain 1220 have their body terminals coupled with VDD and GND, and their body terminals coupled with VDD' and GNC'.

An embodiment presents a logic test signal to input 1241. A first CLK signal at 1243 enables latch 1210 which forwards the logic input signal to logic chain 1220, in which it propagates to latch 1230. If, given the logic reference voltage VDD' and GNC' applied to logic chain 1220, the gates in logic chain 1220 switch fast enough, then the propagated test signal arrives at latch 1230 in time before a second CLK signal at 1243 samples an output of logic chain 1220. If the sampled signal, observable at output 1242, is correctly related to the logic test signal, then the logic chain 1220 switches fast enough, and by inference, the block of logic represented by logic chain 1220 too.

FIG. 12B illustrates a dummy circuit 1250 where a logic chain 1260 includes a signal path that is longer than a critical path of the block of logic represented by dummy circuit 1250. The logic chain 1260 is configured in a ring, and if the output polarity is the inverse of the input polarity, then the ring will oscillate. The oscillation frequency is controlled by the switching speed of logic gates in logic chain 1260, which is in turn controlled by logic reference voltages VDD' and GNC'. Embodiments can measure the frequency at output 1261, or at any other place in the ring. If the frequency meets a minimum value, then the dummy is fast enough, and by inference, the block of logic represented by logic chain 1260 too.

In some embodiments, logic chains 1220 and 1260 may be simple and comprise only a series of inverters. In other embodiments, they may comprise more complicated gates and even partial or full copies of the critical paths represented. Input test signals and output signals may be one-bit wide, or they may comprise multiple bits. Latches 1210 and 1230 may be replaced by more sophisticated sampling systems, or simpler sampling gates.

In online calibration, an embodiment may vary the value of the body bias, continuously or intermittently, to just keep the dummy circuit switching correctly. Both offline and online methods may further include a safety margin in the setting.

Figure 13:
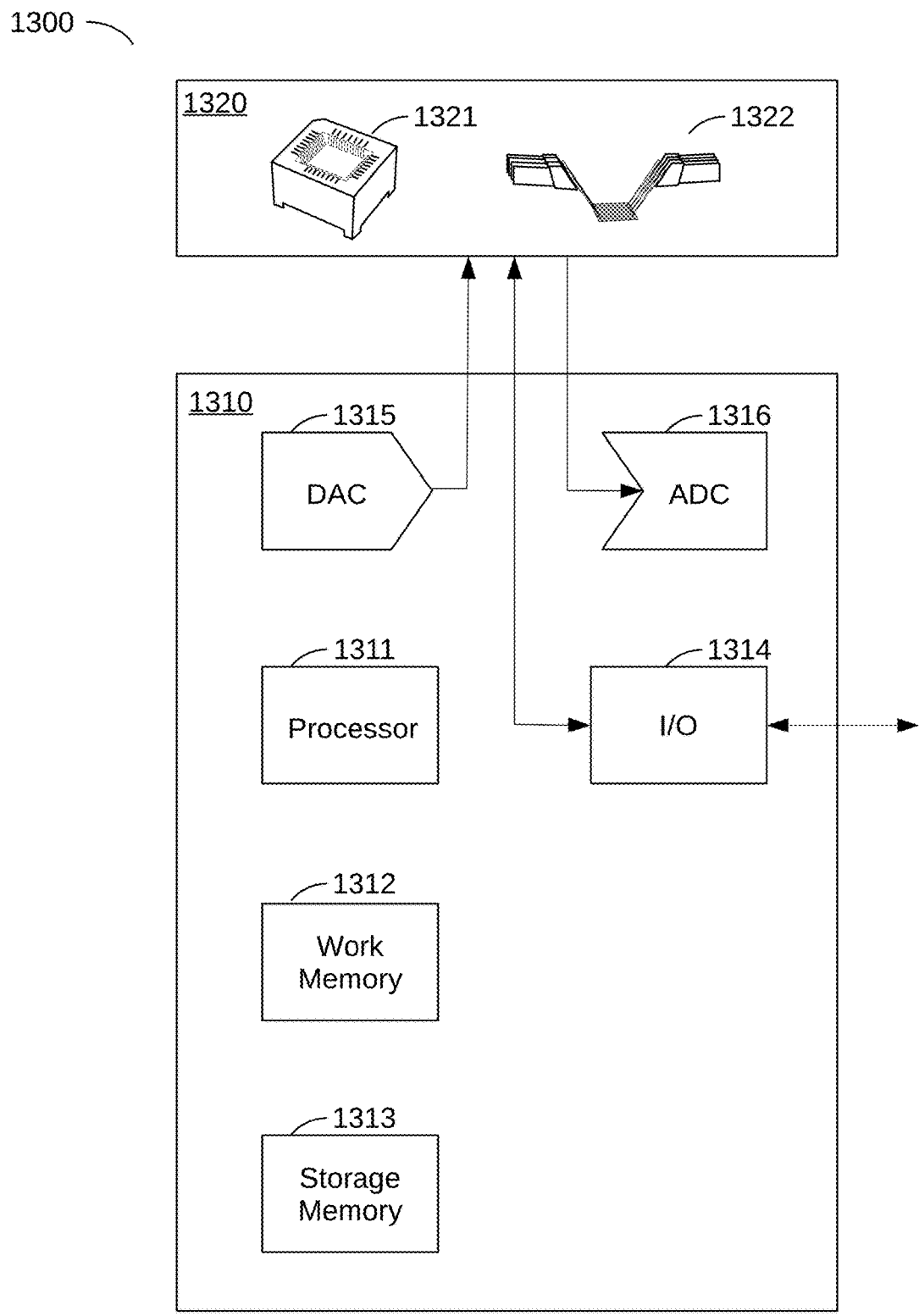
FIG. 13 illustrates a system capable of implementing methods according to embodiments of the invention.

FIG. 13 illustrates an example system 1300 capable of implementing methods according to embodiments of the invention. System 1300 includes IC tester 1310, which may include automated test equipment (ATE) as known in the art, or which may include a general-purpose computer as known in the art; and IC interface board 1320, which may include a custom-built test load board as known in the art, or which may include a breadboard or IC evaluation board.

IC tester 1310 includes one or more processors 1311, capable of and configured for executing software implementing any of the methods described herein; tangible non-transitory work memory 1312, such as random-access memory (RAM), which may be suitable to hold instructions and data being processed; storage memory 1313, such as ROM, Flash, magnetic disks, optical disks, and any other tangible data storage devices capable of holding instructions and/or data when no supply voltage is available; input/output (I/O) devices 1314, such as a keyboard, a mouse, a touchpad, a touchscreen, a display monitor, a loudspeaker, a microphone, a serial communications port such as Ethernet or the universal serial bus (USB), a parallel communications port, a wireless transceiver such as WiFi, or any other computer interface known in the art. Embodiments may further include a digital-to-analog converter (DAC) 1315 and/or an analog-to-digital converter (ADC) 1316.

IC interface board 1320 may include a printed circuit board (PCB) to which an IC including the electronic circuit is permanently attached; and/or it may include a socket 1321 that allows temporary insertion of an IC including the electronic circuit; and/or it may include one or more wafer probes 1322 capable of electrically coupling an electric signal with a naked IC die that includes the electronic circuit. Embodiments may further include a DAC and/or an ADC.

Storage memory 1313 may include software with instructions for carrying out any of the methods described herein. Embodiments pass the instructions on to processor 1311 for execution. Processor 1311 executes the instructions and may use DAC 1315 or any general-purpose or special-purpose DAC included in IC interface board 1320 to apply test signals to the electronic circuit. Processor 1311 may use ADC 1316 or any general-purpose or special-purpose ADC included in IC interface board 1320 to measure responses from the electronic circuit.

Although the description has been described with respect to particular embodiments thereof, these particular embodiments are merely illustrative, and not restrictive. For example, the figures depict embodiments using CMOS logic circuits, whereas the examples could equally well have been depicted, and are equally valid, using regular MOS logic circuits. As another example, the figures depict logic reference voltage rails VDD' and GNC' directly coupled with first impedance Z1 and/or second impedance Z2, whereas embodiments may indirectly couple them, and/or insert buffers, sample and hold circuits, etc. Examples have been presented with a focus on reverse body biasing, whereas the invention equally covers circuits and methods employing forward body biasing. All such variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments or parts of an embodiment may be implemented in a tangible, non-transitory computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments. For example, a tangible medium such as a hardware storage device can be used to store the control logic, which can include executable instructions.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A method for calibrating power dissipation of MOS logic circuits that employ body biasing with a negative feedback loop controlled by a trimmable resistor to decrease an influence of variations in temperature, supply voltage, and manufacturing, the method comprising the following steps:
   (a) operating the MOS logic circuits at their highest expected usage and determining low (L) and high (H) values of an initial trimmable resistor search range;
   (b) setting the trimmable resistor to a value in the range, the value being higher than L and lower than H;
   (c) observing a MOS logic circuits switching behavior to determine if the MOS logic circuits are switching correctly;
   (d) in response to determining that the MOS logic circuits are switching correctly, increasing the value of L to the trimmable resistor's set value to decrease the search range;
   (e) in response to determining that the MOS logic circuits are not switching correctly, decreasing the value of H to the trimmable resistor's set value to decrease the search range;
   (f) determining if the search range is small enough;
   (g) in response to determining that the search range is not small enough, repeating steps (b) through (g);
   (h) in response to determining that the search range is small enough, determining a final calibrated value from the L value and setting the trimmable resistor to the final calibrated value; and
   (i) storing the final calibrated value in an electronic memory.

2. The method of claim 1, further comprising reading the final calibrated value from the electronic memory.

3. The method of claim 1, wherein the observing comprises:
- presenting a logic test word of at least one bit width to at least one input of a chain of logic gates at a first time;
- allowing the logic test word to propagate through the chain of logic gates;
- determining at a second time if an output response word of at least one bit width of the chain of logic gates is correctly related to the logic test word;
- wherein the determination that the output response word is correctly related to the logic test word indicates that the CMOS logic gates switch correctly; and
- the determination that the output response word is not correctly related to the logic test word indicates that the CMOS logic gates do not switch correctly.

4. The method of claim 3, wherein the chain of logic gates comprises at least one dummy circuit.

5. The method of claim 4, wherein the chain of logic gates comprises a chain of inverters.

6. The method of claim 4, wherein the chain of logic gates has a critical path that is longer than a critical path of the CMOS logic gates.

7. The method of claim 3, further comprising using a first latch for presenting the logic test word at the first time and using a second latch for determining the output response word at the second time.

8. The method of claim 1, wherein the observing comprises:
- using a dummy chain of logic gates in a ring oscillator configuration;
- determining a frequency at which the ring oscillator oscillates and comparing this with a minimum value;
- wherein the determination that the oscillation frequency is higher than the minimum value indicates that the CMOS logic gates do switch correctly; and
- the determination that the oscillation frequency is lower than the minimum value indicates that the CMOS logic gates do not switch correctly.

9. A system for calibrating power dissipation of MOS logic circuits that employ body biasing with a negative feedback loop controlled by a trimmable resistor to decrease an influence of variations in temperature, supply voltage, and manufacturing, the system comprising an IC tester coupled with an IC interface board, the IC tester including a processor coupled with a data storage device, wherein the processor is programmed to perform a method comprising:
- (a) operating the MOS logic circuits at their highest expected usage and determining low (L) and high (H) values of an initial trimmable resistor search range;
- (b) setting the trimmable resistor to a value in the range, the value being higher than L and lower than H;
- (c) observing a MOS logic circuits switching behavior to determine if the MOS logic circuits are switching correctly;
- (d) in response to determining that the MOS logic circuits are switching correctly, increasing the value of L to the trimmable resistor's set value to decrease the search range;
- (e) in response to determining that the MOS logic circuits are not switching correctly, decreasing the value of H to the trimmable resistor's set value to decrease the search range;
- (f) determining if the search range is small enough;
- (g) in response to determining that the search range is not small enough, repeating steps (b) through (g);
- (h) in response to determining that the search range is small enough, determining a final calibrated value from the L value and setting the trimmable resistor to the final calibrated value; and
- (i) storing the final calibrated value in an electronic memory.

* * * * *